United States Patent
Cooperman et al.

Patent Number: 5,329,185
Date of Patent: Jul. 12, 1994

[54] CMOS LOGIC CIRCUITRY PROVIDING IMPROVED OPERATING SPEED

[75] Inventors: Michael Cooperman, Framingham; Phillip Andrade, Lexington, both of Mass.

[73] Assignee: GTE Laboratories Incorporated, Waltham, Mass.

[21] Appl. No.: 35,127

[22] Filed: Mar. 19, 1993

[51] Int. Cl.⁵ .......................................... H03K 19/094
[52] U.S. Cl. .................................. 307/475; 307/443; 307/451
[58] Field of Search ................... 307/443, 475, 296.8, 307/451

[56] References Cited

U.S. PATENT DOCUMENTS 4,763,021  8/1988  Stickel ............................... 307/475
4,808,852  2/1989  Kousaka et al. .................... 307/451

OTHER PUBLICATIONS

Taub and Schilling, *Digital Integrated Electronics*, McGraw-Hill Book Co., New York, N.Y., 1977, pp. 260–265.

*Primary Examiner*—David R. Hudspeth
*Attorney, Agent, or Firm*—Victor F. Lohmann, III

[57] ABSTRACT

Electrical circuitry of CMOS inverter circuits in cascade providing a compatible interface between ECL logic levels and CMOS logic levels. The MOS transistors of the first inverter circuit of the series are approximately three times larger than the MOS transistors of the same type in subsequent inverter circuits of the series. The ECL input is to the gate of the N-type transistor of the first inverter circuit. A threshold control input is connected to the gate of the P-type transistor of the first inverter circuit. This configuration increases the operating speed of the first inverter circuit and permits controlling the threshold voltage in order to stabilize the output duty cycle.

5 Claims, 1 Drawing Sheet

CMOS LOGIC CIRCUITRY PROVIDING IMPROVED OPERATING SPEED

REFERENCE TO RELATED APPLICATION

This application contains subject matter which is related to subject matter disclosed and claimed in applications Ser. No. 08/036,132 filed Mar. 19, 1993 entitled "Electrical Circuitry" and Ser. No. 08/035,138 filed Mar. 19, 1993 entitled "Electrical Circuit with Threshold Control" filed concurrently herewith and assigned to the assignee of the present application. These applications filed concurrently herewith are hereby incorporated by reference into the present application.

BACKGROUND OF THE INVENTION

This invention relates to electrical logic circuitry. More particularly, it is concerned with logic circuits which provide an interface between two logic systems.

Two widely-used, well-known logic systems are ECL (emitter coupled logic) and CMOS (complementary metal oxide semiconductor) logic systems. The logic levels for ECL logic are −1.6 volts and −0.8 volt and for CMOS the logic levels are 0 volts and +5 volts. The threshold voltage for CMOS logic, that is the voltage at which a CMOS logic circuit triggers from one operating state to another, is +2.5 volts. Since this voltage is outside the operating range of ECL logic, CMOS logic circuitry is not directly compatible with ECL circuitry. CMOS logic circuits may be made compatible with input from ECL circuitry by changing the operating voltages of the CMOS circuitry to −3.7 volts and +1.3 volts to provide a threshold voltage of −1.2 volts, the threshold voltage of ECL circuitry. The relatively small voltage differential of the ECL logic levels, however, results in a degradation of the operating speed of the CMOS circuit. In addition, the duty cycle of the circuit output signal may vary due to variations in the threshold level at the input.

SUMMARY OF THE INVENTION

Electrical circuitry in accordance with the present invention includes first and second inverter circuits. Each inverter circuit comprises a complementary pair of MOS transistors connected in series between a first voltage source and a second voltage source. An input connection is connected to the gate of one of the MOS transistors of the first inverter circuit. A control connection is connected to the gate of the other of the MOS transistors of the first inverter circuit. The juncture of the MOS transistors of the first inverter circuit are connected to the gates of the MOS transistors of the second inverter circuit. The MOS transistors of the first inverter circuit are larger than the MOS transistors of the same type of the second inverter circuit.

For a better understanding of the present invention, together with other and further objects, advantages, and capabilities thereof, reference is made to the following disclosure and appended claims in connection with the above-described drawings.

DETAILED DESCRIPTION

Figure 1:
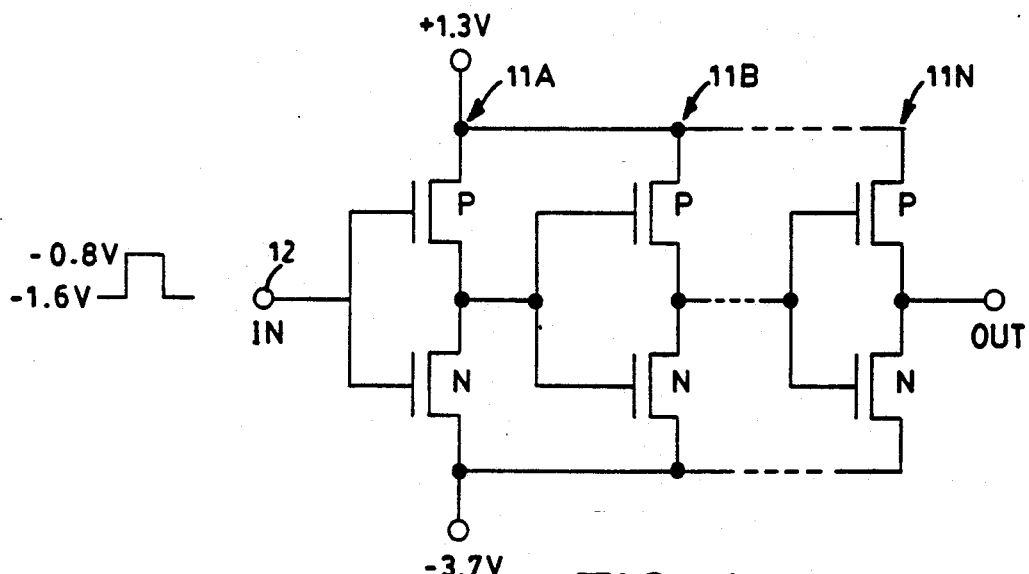
FIG. 1 is a schematic circuit diagram of electrical circuitry in accordance with the prior art.

FIG. 1 is a circuit diagram illustrating a series of CMOS inverter circuits with the output of each stage connected to the input of the subsequent stage in accordance with the prior art. Such an arrangement may be utilized in various types of CMOS circuitry as, for example, in a crosspoint switching array as described in U.S. Pat. No. 4,818,988 to Cooperman and Sieber. The circuits are CMOS inverter circuits and are designed to operate with 5 volt CMOS input levels. These circuits may be adapted to operate with 800 millivolt ECL input levels by employing supply voltages of +1.3 volts and −3.7 volts as shown in FIG. 1.

A series of CMOS inverter circits 11A, 11B, 11N is illustrated in FIG. 1. Each inverter circuit has a P-type MOS transistor and an N-type MOS transistor connected in series between voltage sources of +1.3 volts and −3.7 volts to provide compatibility to serve as an ECL to CMOS converter circuit. As is well understood the gates of the transistors of each pair of inverter transistors are connected together to provide an input, and the juncture between them provides an output. When the voltage at the input is above the threshold voltage, which is midway between the supply voltages, the P-type transistor is nonconducting and the N-type transistor is conducting, producing a voltage at the output which is relatively low. When the voltage at the input is below the threshold voltage, the P-type transistor is conducting and the N-type transistor is nonconducting, producing a voltage at the output which is relatively high.

By virtue of the operating voltages of +1.3 volts and −3.7 volts, the circuit of FIG. 1 is adapted to receive ECL logic input signals of −1.6 volts and −0.8 volt, with a midpoint or threshold voltage of −1.2 volts, at the input 12. Because of the relatively small ECL input range of 800 millivolts, the output of the first inveter stage 11A is of the order of 3 volts rather than the full 5 volts of usual CMOS operation, as explained in U.S. Pat. No. 5,045,730 to Cooperman and Sieber. The operation of the second inverter circuit 11B in the series produces a full 5 volt range at its output. Because of the relatively small ECL input voltage range, the first inverter circuit operates at about half the speed of similar circuits with CMOS input voltages. In addition, slight variations in the threshold voltage at the input stage can cause variations in the output duty cycle of the circuit.

As is well known in the art of CMOS circuitry as described above, the P-type transistors are made larger than the N-type transistors in order to provide each pair with matching complementary characteristics. In the fabrication of an MOS transistor the length of the channel, that is the distance between the source and drain regions of the device is made as small as practicable. The size of an individual device is determined by the width of the channel, that is the dimension of the border between the channel and the source or the channel and the drain. Thus, typically, the lengths of the channels of the P and N-type MOS transistors of a complementary pair are the same, while the width of the channel of the P-type transistor is three times that of its associated N-type transistor.

Figure 2:
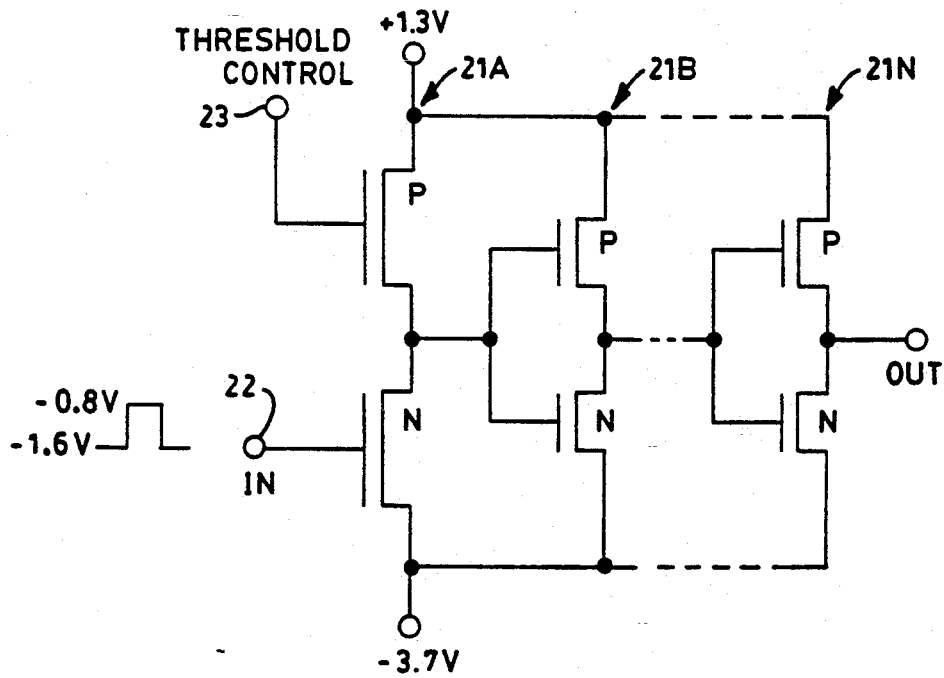
FIG. 2 is a schematic circuit diagram of electrical circuitry in accordance with the present invention.

FIG. 2 is a schematic circuit diagram of an ECL to CMOS logic converter circuit including a series of inverter circuits 21A, 21B, 21N in accordance with the present invention. In this circuit the sizes of the CMOS transistors in the first inverter stage 11A are each three times as large as the MOS transistors of the same type in the other inverter circuits of the series. The size of each transistor of the first inverter circuit 21A is made larger by increasing the width of the channel and thus the current carrying capacity of the channel between the source and drain regions. Thus, the P-type transistor of the first inverter circuit 21A is three times the size of the P-type transistors of the subsequent inverter circuits, and the N-type transistor of the first inverter circuit 21A is three times the size of the N-type transistors of the other inverter circuits. Each P-type transistor is three times the size of the associated N-type transistor in the same inverter circuit.

In the circuit of FIG. 2 the ECL input signals are applied to an input terminal 22 which is connected only to the gate of the N-type transistor of the first inverter circuit 21A. The gate of the P-type transistor of the first inverter circuit 21A is connected to a threshold control 23. By virtue of the transistors of the first inverter circuit 21A being larger than those of the subsequent inverter circuits, the drive capability of the first inverter circuit 21A is increased thereby compensating for the low ECL input swing of 800 millivolts at the input 22. Thus the loss in speed attributed to using the smaller range of ECL input logic levels is overcome. The input capacitance of each of the transistors of the first inverter circuit 21A also increases proportionately. Since in the circuit of FIG. 2 the input 22 is connected only to the N-type transistor, the input capacitance of the first inverter circuit 21A is only one-fourth of what it would be if the input were connected to the gates of both the N-type and the P-type transistors as in the usual manner.

The threshold control input 23 at the gate of the P-type transistor of the first inverter circuit 21A may be employed to control the input threshold of the circuit and thus stabilize the output duty cycle. Under expected normal conditions the threshold control may be set at −1.2 volts which is midway between the ECL logic levels of −1.6 volts and −0.8 volt. Thus the circuit in accordance with the present invention serves as an ECL to CMOS converter with increased operating speed and without output cuty cycle distortion.

While there has been shown and described what is considered a preferred embodiment of the present invention, it will be obvious to those skilled in the art that various changes and modifications may be made therein without departing from the invention as defined by the appended claims.

What is claimed is:

1. Electrical circuitry providing a compatible interface between emitter coupled logic levels and CMOS logic levels including:
    first and second inverter circuits, each inverter circuit comprising a complementary pair of MOS transistors connected in series between a first voltage source and a second voltage source to provide compatibility between emitter coupled logic and CMOS logic levels;
    an input connection connected to the gate on one of the MOS transistors of the first inverter for receiving input signals of the range of emitter coupled logic signals;
    a control connection connected to the gate of the other of the MOS transistors of the first inverter circuit;
    the juncture of the MOS transistors of the first inverter circuit being connected to the gates of the MOS transistors of the second inverter circuit; and
    said MOS transistors of the first inverter circuit being larger than the MOS transistors of the same type of the second inverter circuit thereby providing greater drive capability to compensate for the relatively small range of emitter coupled logic input signals applied to the first inverter circuit.

2. Electrical circuitry in accordance with claim 1 wherein
    the width of the channels of the MOS transistors of the first inverter circuit are larger than the widths of the channels of the MOS transistors of the same type of the second inverter circuit.

3. Electrical circuitry in accordance with claim 2 wherein
    the width of the channel of each of the MOS transistors of the first inverter circuit is approximately three times the width of the channel of each of the MOS transistors of the same type of the second inverter circuit.

4. Electrical circuitry in accordance with claim 3 wherein
    a control voltage at said input connection is operable to set the threshold voltage at the input connection to the mid-point of incoming logic levels.

5. Electrical circuitry in accordance with claim 4 wherein
    said one of the MOS transistors of the first inverter circuit is N-type; and
    said other of the MOS transistors of the first inverter circuit is P-type.

* * * * *